United States Patent
Belwon et al.

(10) Patent No.: US 6,563,056 B1
(45) Date of Patent: May 13, 2003

(54) INSULATION BARRIER ON A PRINTED CIRCUIT BOARD

(75) Inventors: Waldemar Belwon, Västerås (SE); Anders Eriksson, Västerås (SE)

(73) Assignee: Bombardier Transportation GmbH (DE)

( * ) Notice: Subject to any disclaimer, the term of this patent is extended or adjusted under 35 U.S.C. 154(b) by 0 days.

(21) Appl. No.: 09/979,573

(22) PCT Filed: May 15, 2000

(86) PCT No.: PCT/SE00/00957
§ 371 (c)(1),
(2), (4) Date: Nov. 19, 2001

(87) PCT Pub. No.: WO00/72647
PCT Pub. Date: Nov. 30, 2000

(30) Foreign Application Priority Data

May 20, 1999 (SE) .................................................. 9901845

(51) Int. Cl.[7] .................................................. H05K 1/16
(52) U.S. Cl. .......................... 174/260; 29/832; 361/803
(58) Field of Search .............................. 174/260; 439/65, 439/76.1, 77, 78, 85; 29/832–841; 361/760, 803

(56) References Cited

U.S. PATENT DOCUMENTS

| | | | |
|---|---|---|---|
| 4,875,042 A | * 10/1989 | Oku et al. | 340/870.11 |
| 5,035,641 A | 7/1991 | Van-Santbrink et al. | 439/329 |
| 5,157,368 A | 10/1992 | Okano et al. | 336/90 |
| 5,543,831 A | * 8/1996 | Tsuji et al. | 128/901 |
| 5,562,462 A | 10/1996 | Matsuba et al. | 439/70 |
| 5,726,616 A | 3/1998 | Bell | 336/92 |
| 6,018,802 A | * 1/2000 | Abe et al. | 365/229 |
| 6,060,974 A | * 5/2000 | Schroter et al. | 336/192 |
| 6,319,197 B1 | * 11/2001 | Tsuji et al. | 600/132 |

* cited by examiner

*Primary Examiner*—Albert W. Paladini
*Assistant Examiner*—Jeremy Norris
(74) *Attorney, Agent, or Firm*—Webb Ziesenheim Logsdon Orkin & Hanson, P.C.

(57) ABSTRACT

A printed circuit board (PCB) assembly provided with an insulation transformer, which acts as an insulation barrier between two electrical systems. The printed circuit board (PCB) assembly has at least two separate PCB sections, and the insulation transformer is used as a support structure to mechanically interconnect the sections. Since the PCB sections are separated, the PCB sections no longer affect the creepage distance for the insulation barrier. Instead the insulating material and the physical design of the transformer determines the minimum required creepage distance. The insulating material of the transformer generally has a considerably higher CTI value than the PCB material, leading to a relatively short creepage distance being required. By breaking the creepage path on the PCB, the size of transformer will be substantially reduced compared to the prior art arrangements.

19 Claims, 6 Drawing Sheets

INSULATION BARRIER ON A PRINTED CIRCUIT BOARD

TECHNICAL FIELD OF THE INVENTION

The present invention generally relates to an insulation barrier on a printed circuit board, and more particularly to a printed circuit board assembly provided with an insulation transformer, and manufacturing of such a printed circuit board assembly.

BACKGROUND OF THE INVENTION

In order to insulate electrical systems or circuits from each other, insulation transformers are normally employed. An insulation transformer is designed to provide magnetic coupling between electrical systems without introducing significant conductive or electrostatic coupling between them. Insulation is mainly a question of separating connections and components, and hence it is evident that the insulation requirements work against minimizing size of the overall equipment. Accordingly, the construction of insulation transformers typically requires significant clearance and creepage distances to obtain the desired electrical insulation. Here, creepage distance means the shortest distance between two conductors measured along the surface of the insulation.

Figure 1:
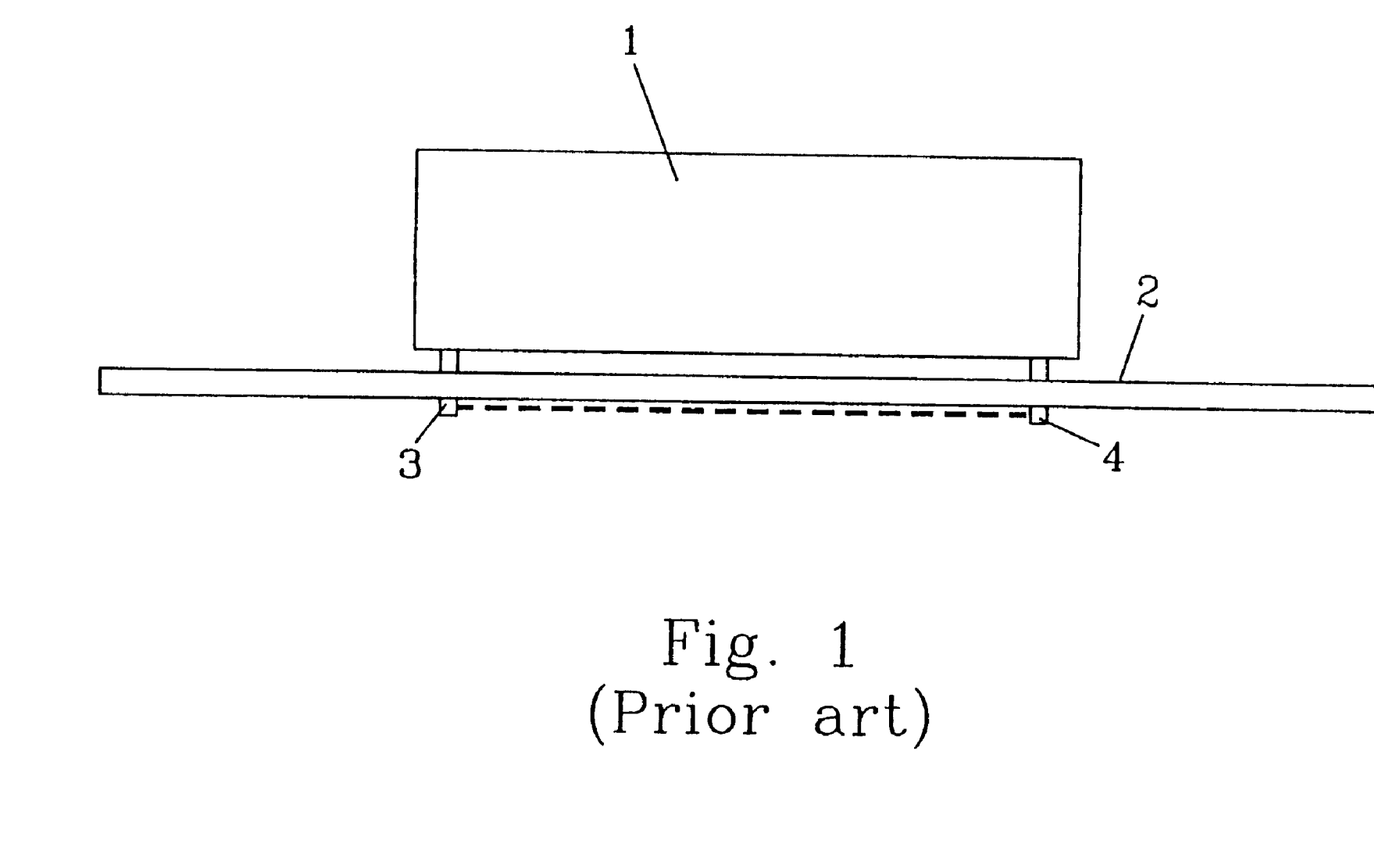
FIG. 1 is a schematic diagram illustrating an insulation transformer provided on a printed circuit board according to the prior art.

FIG. 1 is a schematic diagram illustrating an insulation transformer provided on a printed circuit board (PCB) according to the prior art. The insulation transformer 1 is generally mounted on the PCB 2 by means of conventional transformer pins, a primary side transformer pin 3 and a secondary side transformer pin 4. An insulation transformer for use on a printed circuit board (PCB) is generally designed such that the point-to-point distance along a straight line between the primary side and the secondary side of the transformer is dimensioned for the creepage distance of the PCB. This means that the point-to-point distance between the primary side and the secondary side of the transformer has to be larger than the minimum required creepage distance of the PCB at the relevant voltages.

The comparative tracking index (CTI) is a comparative index that can be used to compare insulating materials with respect to creepage distance. The higher the CTI value, the smaller the required creepage distance. This means that for a small creepage distance, an insulating material of a high CTI value has to be selected.

Although printed circuit boards can be made of a wide variety of materials, they are indeed often made of materials, such as FR4 or similar, which have relatively low CTI values. It is possible to produce PCBs from materials that have higher CTI values, but this may require the use of specialized and expensive materials for the PCB. In practice, the use of such specialized materials is rare, and printed circuit boards generally have relatively low CTI values. Consequently, the required creepage distance becomes rather long. This means that the size of the transformer will have to be relatively big, and that a rather large area of the PCB will be occupied by the transformer.

The present invention overcomes these and other drawbacks of the prior art arrangements.

RELATED ART

U.S. Pat. No. 5,726,616 issued to Bell on Mar. 10, 1998 relates to a transformer with plural bobbins. An assembly cap is fitted around the bobbins and includes flanges for locating a core. The bobbins and the cap are designed such that creepage and clearance requirements are met. The core comprises laminations, which are fitted through the assembly cap and the bobbins, and the cap provides a receptacle for the core. To secure the laminations in position, an assembly cup is mounted around the outside of the laminations.

SUMMARY OF THE INVENTION

It is a general object of the present invention to provide a volume-efficient insulation barrier on a printed circuit board (PCB) or PCB assembly.

In particular it is desirable to provide the required insulation between two electrical systems on a PCB or PCB assembly by means of a relatively small and compact insulation transformer mounted thereon.

Another object of the invention is to improve the creepage characteristics of an insulation transformer used as an insulation barrier on a PCB or PCB assembly.

Still another object of the invention is to provide an efficient method for manufacturing a printed circuit board assembly comprising an insulation transformer.

These and other objects are met by the invention as defined by the accompanying patent claims.

The general idea according to the present invention is to use the insulation transformer as a support structure to mechanically interconnect at least two separate PCB sections. Preferably, the PCB sections are formed by dividing a PCB into sections after mounting of the insulation transformer to the PCB. Since the PCB has been separated, it no longer affects the creepage distance for the insulation barrier. Instead the insulating material of the transformer determines the minimum required creepage distance. The insulating material of the transformer generally has a considerably higher CTI value than the PCB material, leading to a relatively short creepage distance being required. By breaking the creepage path on the PCB, it is thus possible to use a more balanced design of the whole printed circuit board assembly. The following advantages are obtained:

- For any given insulation requirement, the size of transformer will be substantially reduced compared to the prior art arrangements.
- Savings of material for transformer housing and resin.
- The penalty area on the PCB for the transformer will be reduced.
- The lower transformer weight makes it easier to handle printed circuit board vibrations.
- Since the PCB is divided into separate sections, it is no longer necessary to test the PCB at manufacturing to confirm the required insulation, thus eliminating a cost-intensive and time-consuming test procedure.

It should be understood that although an efficient manufacturing of such a PCB assembly normally implies that a PCB is divided into separate sections after mounting of the insulation transformer to the PCB, it is possible to provide the PCB sections as separate pieces from the very beginning.

In order to improve the creepage characteristics of the insulation transformer, the transformer housing is preferably formed in a substantially non-planar manner. Advantageously, the transformer housing is formed with recessed sections, such as slots or similar, and/or projecting sections, such as fins or ribs. In this manner, the distance between the primary side and the secondary side of the transformer along the surface of the transformer housing is increased. In this way, the insulation transformer can be made even more compact.

An efficient way of manufacturing a printed circuit board assembly according to the invention involves making an opening and snap-off sections in the PCB. The snap-off sections are formed on each side of the opening such that the PCB is divided into separate sections when the snap-off sections are removed after mounting of the insulation transformer. First, however, the insulation transformer is placed aligned with the opening and mounted to the PCB such that the PCB will act as a support structure that mechanically interconnects the separate PCB sections. Preferably, the snap-off sections are removed after mounting of the transformer and other components has been completed. In this way, the snap-off sections may provide the required stiffness to the PCB for optimal soldering.

By using a so-called snap-off board technique, it is still possible to efficiently manufacture the printed circuit board assembly on an automated soldering line.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Throughout the drawings, the same reference characters will be used for corresponding or similar elements.

It should be understood that the term "printed circuit board" should not be interpreted in a limited sense as restricted to a circuit board with "printed" components, but rather in a broad sense as any type of conventional circuit board.

Figure 2:
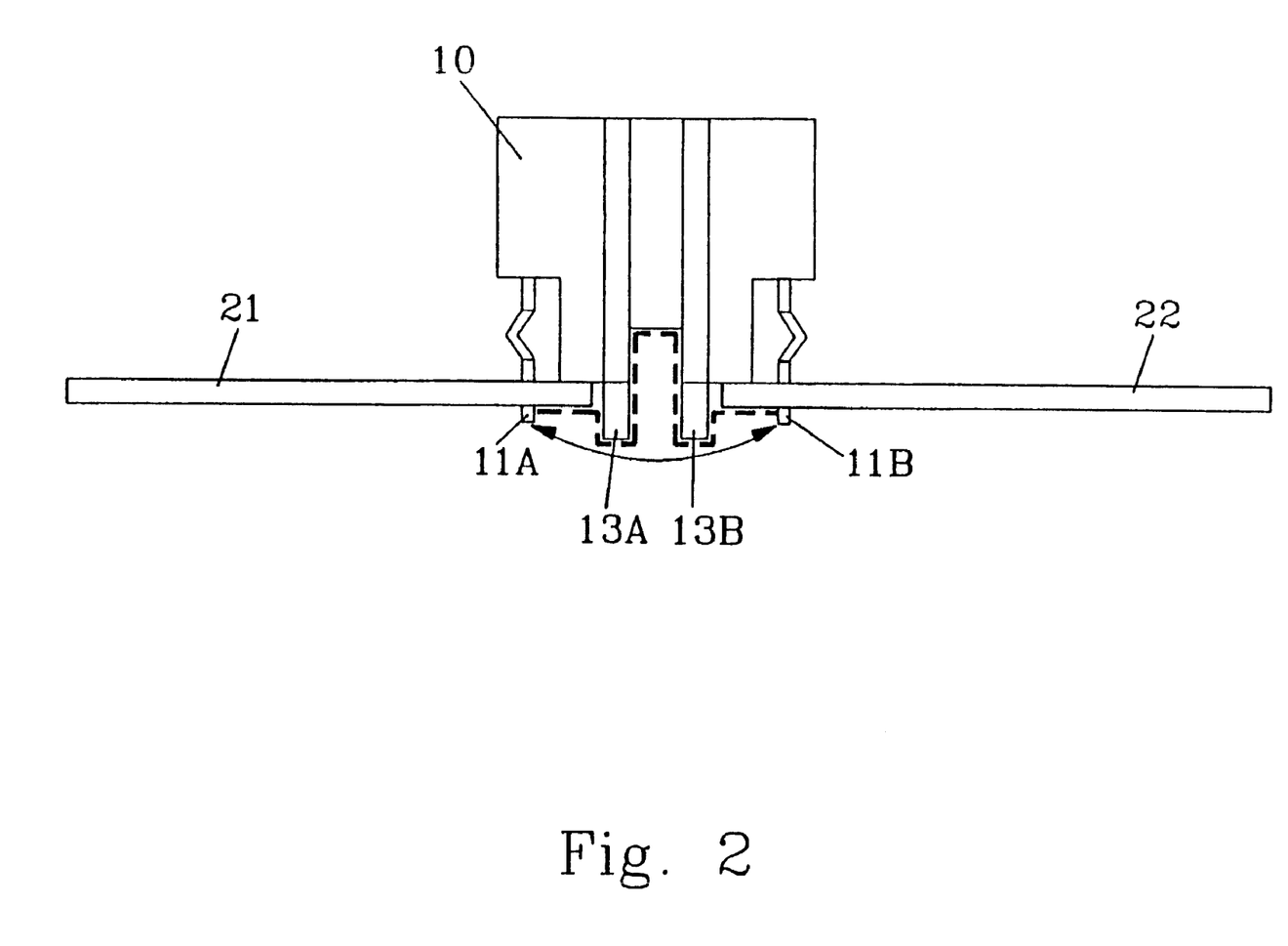
FIG. 2 is a schematic diagram of a printed circuit board assembly according to a first preferred embodiment of the invention.

FIG. 2 is a schematic diagram of a printed circuit board assembly according to a first preferred embodiment of the invention. As can be seen in FIG. 2, the printed circuit board is divided into two separate sections 21, 22, which are interconnected by an insulation transformer 10. In general, each PCB section carries a number of electrical components that constitute a respective electrical system. The transformer 10 has a number of transformer pins 11A on the primary side of the transformer, and a number of transformer pins 11B on the secondary side of the transformer. Preferably, the pins 11A, 11B are through-hole soldered to the PCB sections 21 and 22, respectively. The transformer 10 acts as a support structure that mechanically interconnects the separate PCB sections 21, 22 and holds the whole PCB assembly together. At the same time, the transformer acts as an insulation barrier between the two PCB sections 21, 22. This means that it is possible to utilize the relatively high CTI value of the insulating material of the transformer 10. In general, the insulating material of the transformer body is selected from material group I (CTI>600) or material group II (400≦CTI≦600). As mentioned above, a high CTI value means that a small creepage distance is required. By breaking the creepage path on the PCB and using the insulation transformer 10, with its relatively high CTI value, as the insulator between the electrical systems, the required insulation can be obtained by a relatively small transformer.

The PCB itself can be made of a wide variety of materials such as FR4, polyamide, paperphenol, $Al_2O_2$, PTFE, hydrocarbon with E-glass and APPE with E-glass. It should be understood that since the PCB no longer affects the creepage distance for the insulation barrier, the CTI value of the PCB is not critical.

In addition, the cost-intensive and time-consuming voltage test procedures required by international standards can be reduced according to the invention. Conventionally, an insulation transformer is subjected to a number of voltage tests. First, the transformer is tested by the transformer manufacturer. Next, when the transformer has been mounted on the PCB, the PCB is tested. Finally, when the PCB assembly has been mounted in a larger system, the whole system is tested. However, each voltage test degrades the isolation barrier of the transformer. According to the invention, it is no longer necessary to test the insulation properties of the PCB since there is no creepage path between the electrical systems on the PCB. In other words, the insulation test procedure at manufacturing of the PCB may be eliminated. In general, this means that the transformer is subjected to voltage tests only two times, not three times as in the prior art. This is a clear advantage offered by the invention.

It is also feasible to make a PCB assembly with excellent insulation characteristics by providing the PCB sections as separate pieces from the beginning. In such a case, the PCB sections may even be provided as separate printed circuit boards made of different materials. For example, one of the PCB sections may require a specialized and expensive material due to the use of high-voltage or due to thermal requirements on the PCB material, whereas it might be sufficient with a less expensive material for the other PCB section.

Naturally, this opens up new possibilities for the PCB assembly designer, and gives a higher degree of design freedom.

In order to improve the creepage characteristics for the insulation transformer 10, the transformer is preferably provided with at least one recessed section, such as a slot or similar, and/or projecting section, such as a fin or rib running on at least one side of the transformer housing. Preferably, these sections extend along the sides and bottom of the transformer housing. As illustrated in FIG. 2, the fins 13A–B extend through the opening between the PCB Sections 21, 22 into the soldering side of the PCB, with a recess formed between the fins. The conventional PCB soldering technique allows the transformer fins 13A–B to be immersed up to 3.5 mm into the soldering bath. This greatly increases the distance between the primary side and the secondary side of the transformer along the surface of the transformer housing. It can be seen that the shortest path, i.e. the creepage path, along the surface of the transformer housing is determined by the location of the transformer pins 11A and 11B. Since, the fins 13A–B extend into the soldering side of the PCB, the clearance distance will be increased as well. In FIG. 2, the creepage path is indicated by a dotted line, and the clearance path is indicated by the arrowheaded line. As can be seen from FIG. 2, the clearance distance now becomes the critical parameter. Usually, with traditional insulation transformers, the creepage distance is critical.

Apparently, the fins give a significant improvement of the creepage characteristics, with maintained or improved clearance characteristics as well. However, under certain circumstances when the clearance situation is under control, it is possible to dispense with the fins and use only one or more recessed sections to improve the creepage characteristics.

Although the recessed and/or projecting section(s) preferably extend continuously along one or more sides of the transformer housing, it should be understood that the recessed and/or projecting sections can be arranged in a variety of different configurations in order to improve creepage characteristics. For example, two or more slots or fins arranged substantially in parallel with each other on one or more sides of the transformer housing do not necessarily have to extend continuously along the entire surface side or sides as long as they are arranged in an overlapping manner, resulting in an increased creepage path in the direction perpendicular to the extending slots or fins.

Electrically, the transformer 10 can be designed as any suitable conventional transformer of printed-circuit-board type.

Figure 3A:
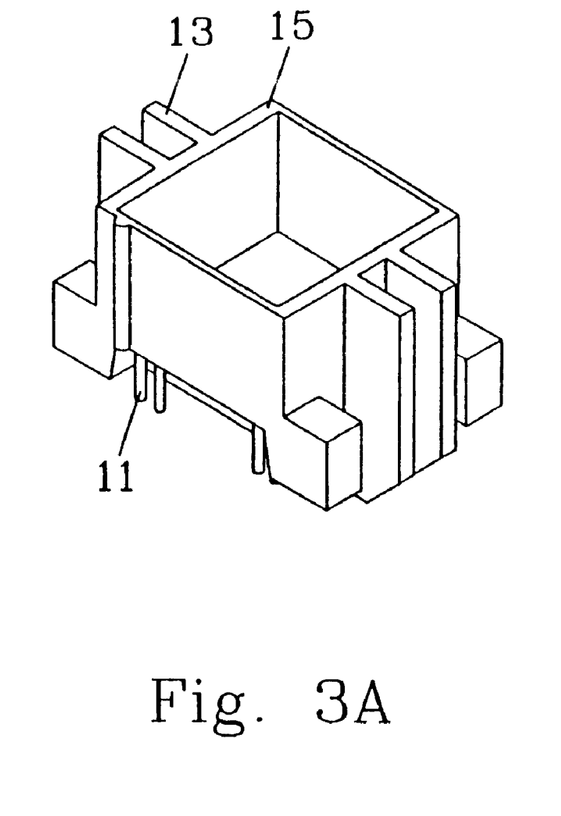
FIGS. 3A–B are perspective views of a housing for an insulation transformer according to the invention.
Figure 3B:
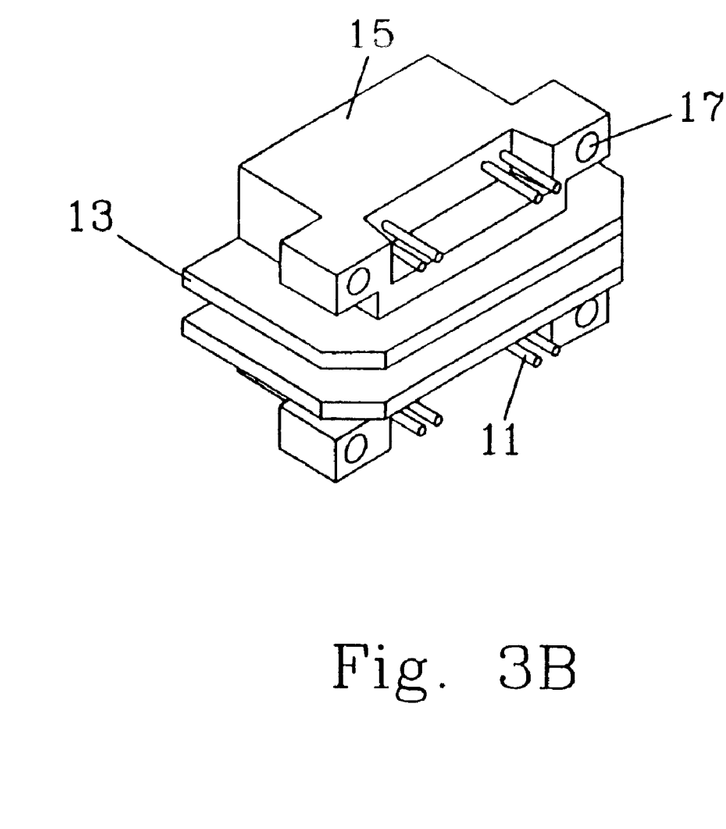

FIGS. 3A–B are perspective views of a housing for an insulation transformer according to the invention. The transformer housing has a main body 15, a number of fins 13 provided along the housing body, transformer pins 11 and holes 17 for engagement with fixing screws (not shown). Preferably, the fins 13 extend continuously along at least three sides of the transformer housing along a first sidewall, along the bottom and along a second sidewall opposite the first sidewall.

The sidewalls extending from the primary side to the secondary side of the transformer are normally reinforced to be able to carry the weight of the printed circuit board and the weight of the transformer.

Figure 4A:
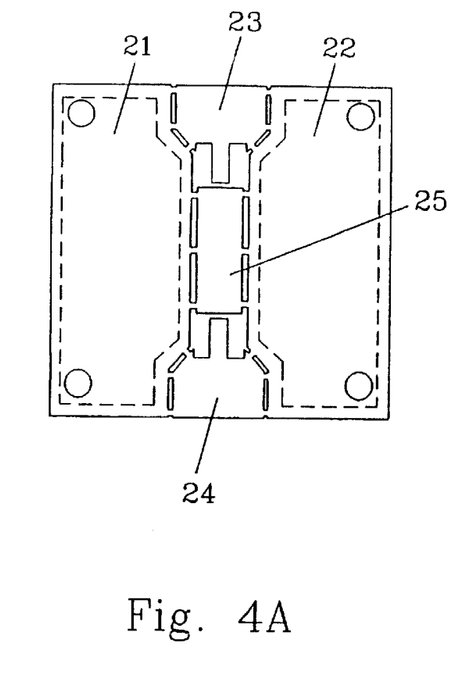
FIGS. 4A–C are schematic diagrams illustrating a method for manufacturing a printed circuit board assembly according to the invention.
Figure 4B:
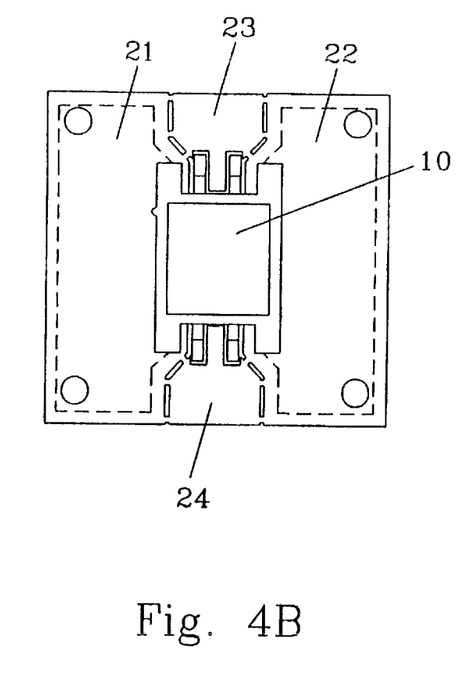
Figure 4C:
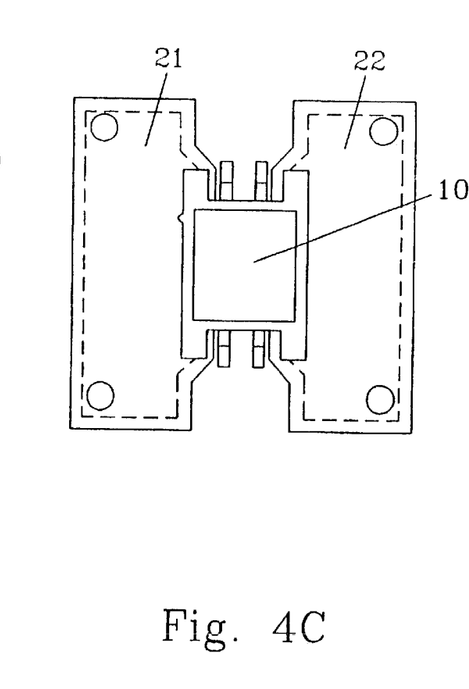

FIGS. 4A–C are schematic diagrams illustrating a method for manufacturing a printed circuit board assembly according to the invention. FIG. 4A illustrates a standard printed circuit board (PCB) provided with three snap-off sections 23, 24, 25 between two main sections 21, 22. The snap-off section 25 is removed to define a central opening in the PCB for receiving the transformer. The transformer 10 is placed aligned with the central opening as illustrated in FIG. 4B. The snap-off sections 23, 24 are retained in position and active in holding the two main sections 21, 22 together during mounting of the transformer 10 and other components. Preferably, the transformer is fixed to the PCB by means of conventional fixing screws, and then soldered to the PCB. After mounting, the snap-off sections 23, 24 are removed to separate the two main sections 21, 22, as illustrated in FIG. 4C. The transformer 10 interconnects the two separate PCB sections 21, 22. Thus, the insulating material of the transformer 10 determines the minimum required creepage distance.

Alternatively, the central opening in the PCB is made by means of drilling or punching. Of course, it is also possible to separate the two main sections by other techniques than the snap-off board technique. However, for manufacturing on an automated soldering line, the snap-off board technique is preferred.

The snap-off section 25 is normally removed after the soldering process, usually done by infrared or similar soldering technique, of the primary side of the PCB, prior to transformer montage. In the same manner, the snap-off sections 23, 24 are preferably removed after soldering the secondary side of the PCB.

Figure 5:
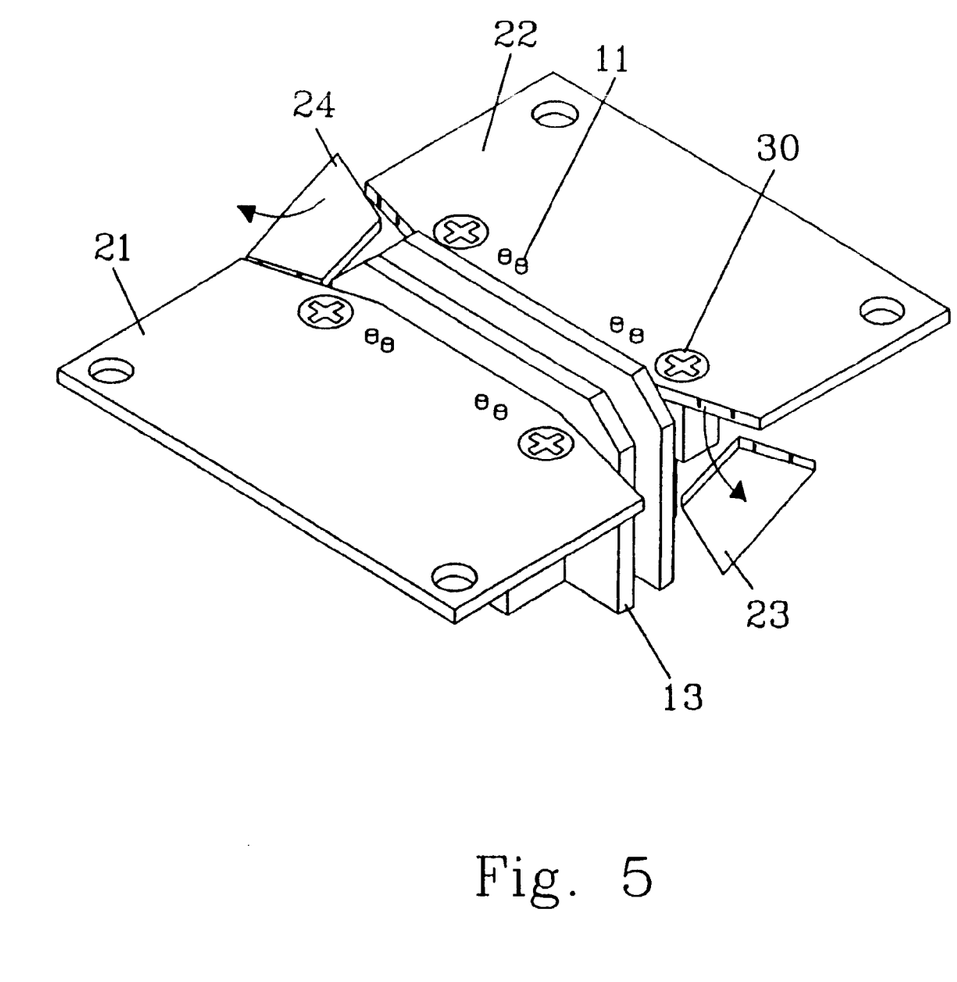
FIG. 5 is a schematic view, from the soldering side, of a printed circuit board assembly according to the invention.

FIG. 5 is a schematic view, from the soldering side, of a printed circuit board assembly according to the invention. The assembly basically comprises two main PCB sections 21, 22 mechanically interconnected by an insulation transformer. The transformer is fixed to the PCB sections by means of fixing screws 30. The transformer pins 11 are through-hole soldered to the PCB, and extend some distance (1–2 mm for example) from the PCB to enable sufficient exposure to the soldering. The snap-off sections 23, 24 are being removed after soldering. FIG. 5 illustrates how the fins 13 of the transformer housing extend along the line dividing the PCB sections 21, 22.

For a better understanding of the invention, an example of a more detailed implementation of a printed circuit board assembly will now be described with reference to a particular application.

Static converters for motor speed control normally use power semiconductors to Control the motor current. The power semiconductors are controlled by printed circuit board based electronics called gate drive units (GDU). The GDUs are often supplied from a low voltage system by means of a small transformer, which has to provide sufficient insulation between the low voltage system and the power circuit of the converter. When Insulated Gate Bipolar Transistors (IGBTs) are used as power semiconductors for motor converters, the necessary supply power for the GDU will be below 10 W. This means that the transformer can be mounted directly on the printed circuit board. Assume that a transformer of 10 W power is to be used between a low voltage and high voltage system. According to standards, it is thus necessary to provide a reinforced insulation between the primary side and the secondary side of the transformer.

Table I below summarizes the requirements for two different high voltage systems, one with a rated insulation voltage of 1800 V and another with a rated insulation voltage of 4200 V.

TABLE I

| | 1800V system | 4200V system |
|---|---|---|
| Rated insulation voltage (UNm) | 1800 V | 4200 V |
| Rated impulse voltage (UNi) | 16 kV | 28.8 kV |
| Clearance (Cl) | 19.3 mm | 38 mm |
| According to prEN50124-1:1998 | | |
| Creepage (Cr) Transformer body | 25.6 mm | 59.6 mm |
| Material group II, 400 ≦ CTI ≦ 600 | | |
| Pollution degree PD2 | | |
| According to prEN50124-1:1998 | | |
| Creepage (Cr) Transformer body | 18 mm | 42 mm |
| Material group I, CTI > 600 | | |
| Pollution degree PD2 | | |
| According to prEN50124-1:1998 | | |
| Creepage (Cr) PCB | 36 mm | 84 mm |

As can be seen from Table I, the creepage distance for a conventional insulation transformer mounted on a PCB as illustrated in FIG. 1 is determined by the material of the PCB and has to be at least 36 mm for a 1800 V system. For an insulation transformer according to the invention, the minimum required creepage distance for a 1800 V system is 18 mm or 25.6 mm, depending on the material group of the transformer housing. If the transformer material is selected from Group II, the minimum required creepage distance for an 1800 V system is 25.6 mm. The clearance distance is 19.3 mm. By providing the transformer housing with fins such as those illustrated in FIG. 2 or equivalents, the clearance distance of 19.3 mm can be made the critical parameter. Hence, a distance of around 20 mm between the primary side and the secondary side of the transformer is sufficient, just fulfilling the clearance requirement. This is a substantial improvement compared to the corresponding distance of 36 mm for a conventional arrangement.

Figure 6A:
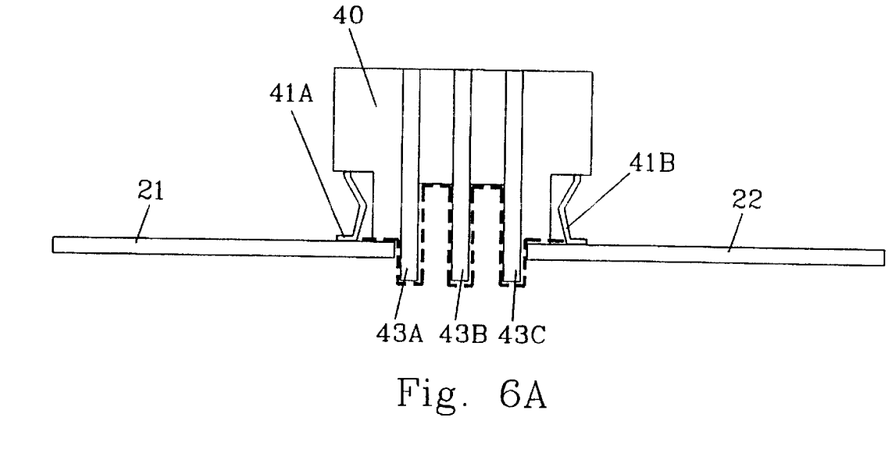
FIGS. 6A–B are schematic diagrams of a printed circuit board assembly according to a second preferred embodiment of the invention.
Figure 6B:
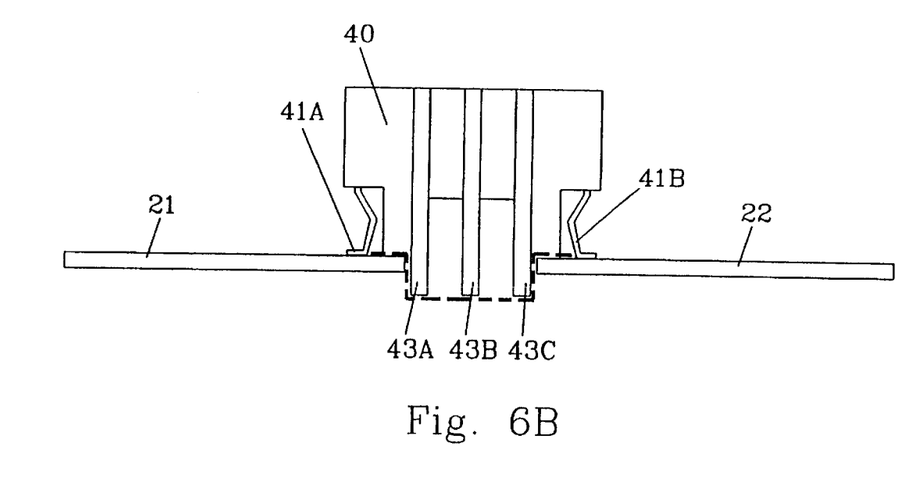

When a higher insulation voltage, such as 4200 V, is required, the clearance distance can be increased by using surface soldered transformer pins as illustrated in FIGS. 6A–B. FIGS. 6A–B are schematic diagrams of a printed circuit board assembly according to a second preferred embodiment of the invention. The arrangement of FIGS. 6A–B is similar to that of FIG. 2, except for the transformer pins 41A, 41B which are now surface soldered to the PCB sections 21, 22. As before, the transformer 40 is provided with a number of fins 43A–C in order to improve the creepage characteristics of the transformer. The creepage distance is indicated by the dotted line in FIG. 6A, whereas the clearance distance is indicated by the dotted line in FIG. 6B.

It should however be noted that if the transformer is mounted tight to the PCB, the air path depicted in FIG. 6B will not be valid. Instead, the clearance path will be running around the side of the transformer, providing an even longer clearance distance.

The embodiments described above are merely given as examples, and it should be understood that the present invention is not limited thereto. As an example, a transformer designer may have to adapt the transformer for housing toll and transformer manufacturability. Further modifications, changes and improvements which retain the basic underlying principles disclosed and claimed herein are within the scope of the invention.

What is claimed is:

1. A method for obtaining an insulation barrier on a printed circuit board (PCB) assembly by means of an insulation transformer, wherein said method comprises the steps of:
   mechanically interconnecting separate PCB sections by means of said insulation transformer; and
   forming the housing of said insulation transformer with at least one recessed section and/or projecting section extending along at least one side of said transformer housing.

2. The method for objecting an insulation barrier according to claim 1, wherein said separate PCB sections are formed by dividing a PCB into said sections after mounting of said insulation transformer to said PCB.

3. The method for obtaining an insulation barrier according to claim 1, wherein said separate PCB sections are initially provided as separate pieces.

4. The method for obtaining an insulation barrier according to claim 1, further comprising the step of selecting as insulating material for said insulation transformer, a material having a comparative tracking index (CTI) that is higher than the CTI of the PCB sections.

5. The method for obtaining an insulation barrier according to claim 1, further comprising the step of forming the housing of said insulation transformer in a substantially non-planar manner in order to improve creepage characteristics.

6. The method for obtaining an insulation barrier according to claim 1, wherein said insulation transformer is surface soldered to said PCB sections.

7. A printed circuit board (PCB) assembly having an insulation transformer, said PCB assembly comprising at least two separate PCB sections, and said insulation transformer acts as a support structure to mechanically interconnect the sections, and said insulation transformer has a housing formed with at least one recessed section and/or projecting section extending along at least one side of said transformer housing.

8. The printed circuit board assembly according to claim 7, wherein said separate PCB sections are formed from a PCB, which is divided into said sections.

9. The printed circuit board assembly according to claim 7, wherein said separate PCB sections are initially provided in the form of separate printed circuit boards.

10. The printed circuit board assembly according to claim 7, wherein said insulation transformer has an insulating material with a comparative tracking index (CTI) that is higher than the CTI of the PCB sections.

11. The printed circuit board assembly according to claim 7, wherein a primary side of said transformer is mounted to a first of said separate sections and a secondary side of said transformer is mounted to a second of said separate sections.

12. The printed circuit board assembly according to claim 7, wherein the housing of said insulation transformer is formed in a substantially non-planar manner so as to improve creepage characteristics.

13. The printed circuit board assembly according to claim 7, wherein each projecting section is formed such that the distance between a primary side and a secondary side of said transformer along the surface of said transformer housing is increased in at least one direction.

14. The printed circuit board assembly according to claim 7, wherein each projecting section includes at least one fin or rib extending along at least three sides of said transformer housing.

15. A method for manufacturing a printed circuit board assembly for providing an insulation transformer as an insulation barrier between a first section and a second section of a printed circuit board (PCB), wherein said method comprises the steps of:
   making an opening in said PCB;
   making snap-off sections in said PCB on each side of said opening, each of said snap-off sections extending from said opening to a respective edge of said PCB;
   placing said insulation transformer aligned with said opening;
   mounting said transformer to said PCB on said first section as well as on said second section of said PCB, said mounting at least comprising soldering said transformer to said PCB; and
   removing said snap-off sections of said PCB to separate the first section and the second section of said PCB;
   whereby said insulation transformer acts as a support structure mechanically interconnecting the first section and second section of the PCB, and the insulating material of said transformer determines the minimum required creepage distance for said insulation barrier.

16. The method for manufacturing a PCB assembly according to claim 15, wherein said step of removing said snap-off sections is performed after said mounting step.

17. The method for manufacturing a PCB assembly according to claim 15, further comprising the step of form ing the housing of said transformer with at least one recessed section and/or projecting section.

18. The method for manufacturing a PCB assembly according to claim 17, wherein each projecting section is formed as at least one fin or rib extending substantially in the direction of the line dividing said PCB sections and extending through said opening.

19. The method for manufacturing a PCB assembly according to claim 15, wherein said opening is made by making a snap-off section in said PCB and then removing said snap-off section from said PCB.

* * * * *